US012171096B2

(12) United States Patent
Yu et al.

(10) Patent No.: US 12,171,096 B2
(45) Date of Patent: Dec. 17, 2024

(54) MICROELECTRONIC DEVICES, AND RELATED MEMORY DEVICES AND ELECTRONIC SYSTEMS

(71) Applicant: Micron Technology, Inc., Boise, ID (US)

(72) Inventors: Erwin E. Yu, San Jose, CA (US); Michele Piccardi, Cupertino, CA (US); Surendranath C. Eruvuru, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 507 days.

(21) Appl. No.: 17/445,045

(22) Filed: Aug. 13, 2021

(65) Prior Publication Data

US 2023/0047662 A1    Feb. 16, 2023

(51) Int. Cl.
| | | |
|---|---|---|
| *G11C 5/06* | (2006.01) | |
| *G11C 5/02* | (2006.01) | |
| *H01L 23/538* | (2006.01) | |
| *H01L 27/092* | (2006.01) | |
| *H10B 41/27* | (2023.01) | |

(Continued)

(52) U.S. Cl.
CPC ............ *H10B 41/27* (2023.02); *G11C 5/025* (2013.01); *G11C 5/06* (2013.01); *H01L 23/5386* (2013.01); *H01L 27/092* (2013.01); *H10B 43/27* (2023.02); *B81B 1/00* (2013.01); *B81B 2201/07* (2013.01)

(58) Field of Classification Search
CPC ........ H10B 41/27; H10B 41/40; H10B 41/50; H10B 43/27; H10B 43/35; G11C 5/025; G11C 5/06; G11C 5/147; G11C 5/066; G11C 2207/105; H01L 23/5386; H01L 24/08; H01L 27/092; H01L 25/18; H01L 23/52; B81B 1/00; B81B 2201/07

See application file for complete search history.

(56) References Cited

U.S. PATENT DOCUMENTS

| | | |
|---|---|---|
| 10,848,059 B1 | 11/2020 | Muralidharan et al. |
| 2006/0076690 A1 | 4/2006 | Khandros et al. |

(Continued)

FOREIGN PATENT DOCUMENTS

CN    112614853 A    4/2021

OTHER PUBLICATIONS

German First Office Action for German Application No. 102022120358.1, dated May 10, 2024, 19 pages with translation.

(Continued)

*Primary Examiner* — Farun Lu
*Assistant Examiner* — Sandra Milena Rodriguez Villan
(74) *Attorney, Agent, or Firm* — TraskBritt

(57) ABSTRACT

A microelectronic device comprises a base structure, a memory array overlying the base structure, and a conductive pad tier overlying the memory array. The base structure comprises a logic region including logic devices. The memory array comprises vertically extending strings of memory cells within a horizontal area of the logic region of the base structure. The conductive pad tier comprises first conductive pads substantially outside of the horizontal area of the logic region of the base structure, and second conductive pads horizontally neighboring the first conductive pads and within the horizontal area of the logic region of the base structure. Memory devices and electronic systems are also described.

24 Claims, 4 Drawing Sheets

(51) Int. Cl.
*H10B 43/27* (2023.01)
*B81B 1/00* (2006.01)

(56) References Cited

U.S. PATENT DOCUMENTS

| | | |
|---|---|---|
| 2017/0125433 A1* | 5/2017 | Ogawa ................. H01L 23/5226 |
| 2019/0157280 A1 | 5/2019 | Wang et al. |
| 2019/0206845 A1* | 7/2019 | Ito ............................ G11C 5/14 |
| 2020/0203329 A1 | 6/2020 | Kanamori et al. |
| 2021/0043525 A1 | 2/2021 | Cerafogli et al. |
| 2021/0134819 A1 | 5/2021 | Zhang et al. |
| 2021/0313246 A1* | 10/2021 | Matsumura ............ H10B 43/40 |
| 2022/0189984 A1* | 6/2022 | Okina ................. H01L 23/5226 |
| 2022/0208705 A1* | 6/2022 | Chen .................. H01L 25/0657 |

OTHER PUBLICATIONS

Korean Notice of Reasons for Rejection for Korean Application No. 10-2022-0101955, dated Sep. 11, 2024, 6 pages with English translation.

* cited by examiner

MICROELECTRONIC DEVICES, AND RELATED MEMORY DEVICES AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through a stack structure including tiers of conductive materials and insulative materials. Each string of memory cells may include at least one select device coupled in series to a serial combination of vertically stacked memory cells. Such a configuration permits a greater number of switching devices (e.g., transistors) to be located in a unit of die area (e.g., length and width of active surface consumed) by building the array upwards (e.g., vertically) on a die, as compared to structures with conventional planar (e.g., two-dimensional (2D)) arrangements of transistors.

In a conventional non-volatile memory device (e.g., a conventional 3D NAND Flash memory device), a die (e.g., a semiconductor die) including a vertical memory array and associated internal circuitry is electrically connected to external circuitry of a relatively larger assembly (e.g., an electronic package, such as an integrated circuit (IC) package) by way of bond pads positioned along a perimeter of the die, and bond wires extending between the bond pads and the conductive contacts (e.g., leads) coupled to the external circuitry. However, conventional bond pad configurations can hamper improvements in the performance of the non-volatile memory device, and/or can impede reductions to the sizes (e.g., horizontal areas) of features of the non-volatile memory device.

DETAILED DESCRIPTION

Figure 1A:
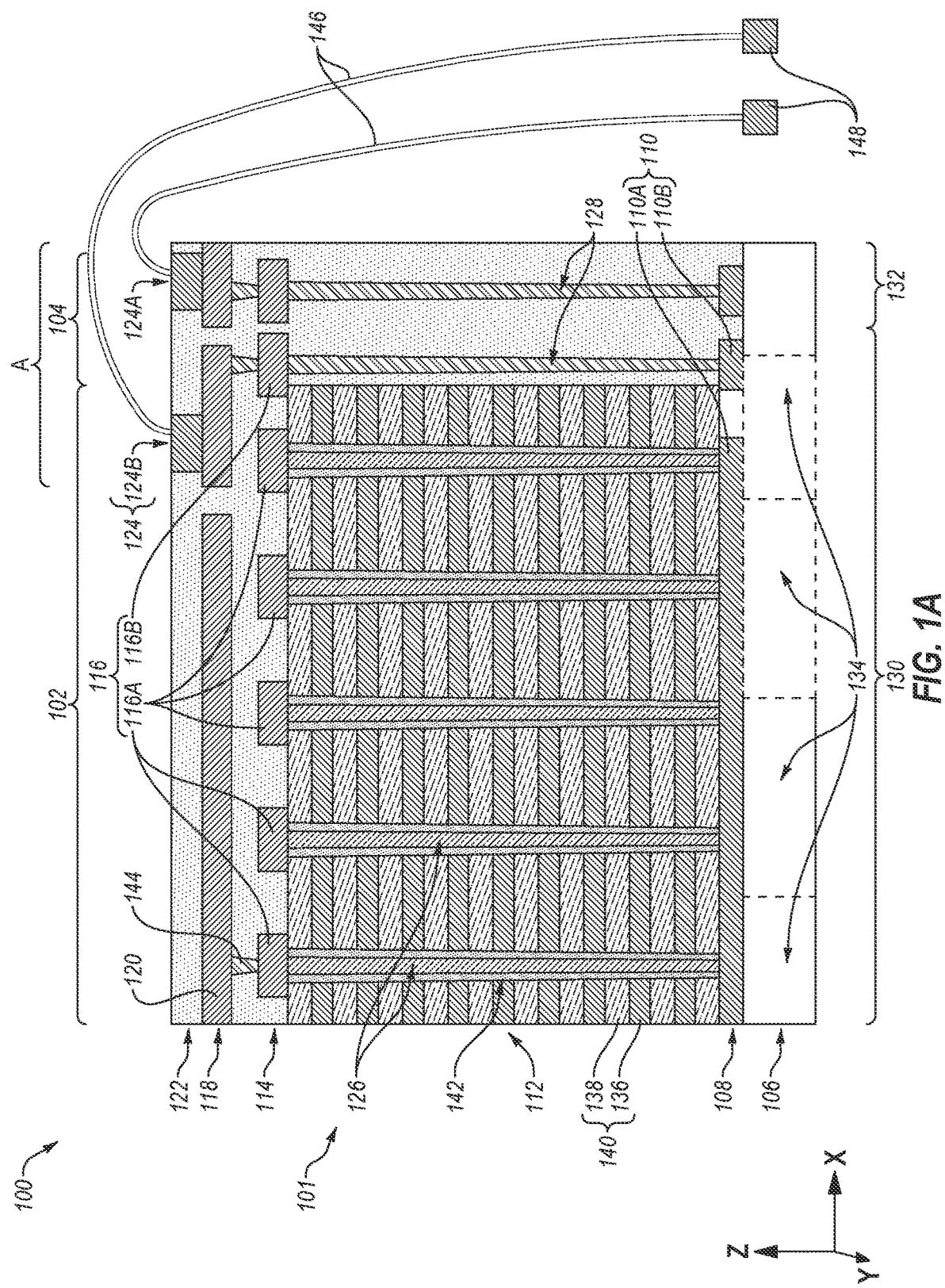
FIG. 1A is simplified, partial cross-sectional view of a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional DRAM), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

Figure 1B:
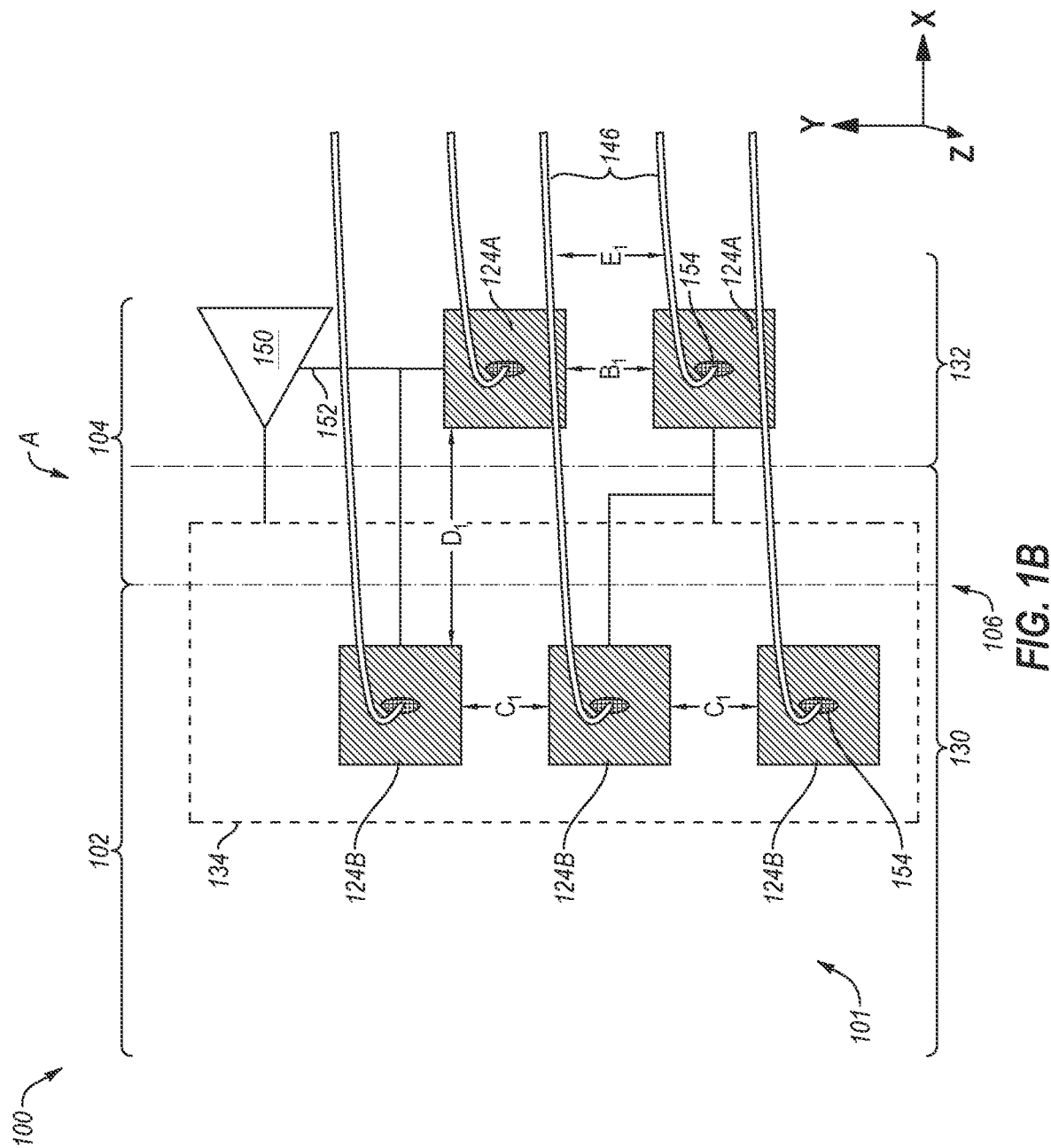
FIG. 1B is a simplified, partial top-down view of a portion of the microelectronic device shown in FIG. 1A.

FIG. 1A is a simplified, partial cross-sectional view of a microelectronic device 100 (e.g., a semiconductor device; a memory device, such as a 3D NAND Flash memory device), in accordance with embodiments of the disclosure. FIG. 1B is a simplified, partial top-down view of a portion A of the microelectronic device 100 shown in FIG. 1A. For clarity and ease of understanding of the drawings and related description, not all components (e.g., features, structures, devices) of the microelectronic device 100 depicted in FIG. 1A are depicted in FIG. 1B. For example, some components of the microelectronic device 100 vertically overlying other components of the microelectronic device 100 are not shown in FIG. 1B so as to provide a clearer top-down view of the other components.

Referring to FIG. 1A, the microelectronic device 100 includes a die 101 including a memory array region 102 and a contact region 104 (e.g., a deep contact region) horizontally neighboring (e.g., in the X-direction) the memory array region 102. In some embodiments, the contact region 104 is positioned at or proximate an outer horizontal boundary (e.g., a peripheral boundary, an outer perimeter) of the die 101, and the memory array region 102 is positioned horizontally inward of the contact region 104. The memory array region 102 may be horizontally interposed (e.g., in the X-direction) between the contact region 104 and one or more other region(s) (e.g., an additional contact region, such as an access line contact region) of the die 101. As described in further detail below, the die 101 of the microelectronic device 100 includes various features (e.g., materials, structures, devices) within horizontal areas of the different horizontal regions (e.g., the memory array region 102, the contact region 104) thereof.

As shown in FIG. 1A, the die 101 of the microelectronic device 100 may include a base structure 106, at least one first conductive routing tier 108 including first conductive routing structures 110 vertically overlying (e.g., in the Z-direction) the base structure 106, a stack structure 112 vertically overlying the first conductive routing tier 108, at least one second conductive routing tier 114 including second conductive routing structures 116 vertically overlying the stack structure 112, at least one third conductive routing tier 118 including third conductive routing structures 120 vertically overlying the second conductive routing tier 114, and at least one conductive pad tier 122 including conductive pads 124 (e.g., bond pads) vertically overlying the third conductive routing tier 118. The die 101 of the microelectronic device 100 may also include cell pillar structures 126 within the memory array region 102 thereof, and contact structures 128 (e.g., deep contact structures) within the contact region 104 thereof. The foregoing features of the microelectronic device 100 are described in further detail below. The microelectronic device 100 further includes additional features, as also described in further detail below.

The base structure 106 comprises a base material or construction upon which additional features (e.g., materials, structures, devices) of the microelectronic device 100 are formed. The base structure 106 may comprise a semiconductor structure (e.g., a semiconductor wafer), or a base semiconductor material on a supporting structure. For example, the base structure 106 may comprise a conventional silicon substrate (e.g., a conventional silicon wafer), or another bulk substrate comprising semiconductor material. In some embodiments, the base structure 106 comprises a silicon wafer. The base structure 106 may be formed to include different regions, materials, structures, and/or devices therein and/or thereon.

As shown in FIG. 1A, the base structure 106 may include at least one logic region 130 (also referred to herein as at least one "active region" or at least one "first region") and at least one additional region 132 (also referred to herein as at least one "inactive region" or at least one "second region") horizontally neighboring the logic region 130. The logic region 130 may include logic devices therein, and may be at least partially positioned within horizontal boundaries (e.g., within a horizontal area) of the memory array region 102 of the die 101 of the microelectronic device 100. In some embodiments, the logic region 130 of the base structure 106 also horizontally extends into the contact region 104 of the die 101 of the microelectronic device 100. The additional region 132 may be free of logic devices therein, and may be at least partially positioned within horizontal boundaries (e.g., within a horizontal area) of the contact region 104 of the die 101 of the microelectronic device 100. In some embodiments, the additional region 132 of the base structure 106 is substantially confined within the contact region 104 of the die 101 of the microelectronic device 100.

The logic devices within the logic region 130 of the base structure 106 are configured to control various operations of the microelectronic device 100. The logic devices are formed of and include logic circuitry. In some embodiments, at least some of the logic devices within the logic region 130 are formed of and include complementary metal-oxide-semiconductor (CMOS) circuitry. As a non-limiting example, the logic devices included within the logic region 130 of the base structure 106 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{dd}$) regulators, string drivers, page buffers, and various chip/deck control circuitry. As another non-limiting example, the logic devices included within the logic region 130 of the base structure 106 may include devices configured to control column operations for arrays (e.g., memory arrays) within the memory array region 102 of the die 101 of the microelectronic device 100, such as one or more (e.g., each) of decoders (e.g., local deck decoders, column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices. As a further non-limiting example, the logic devices included within the logic region 130 of the base structure 106 may include devices configured to control row operations for arrays (e.g., memory arrays) within the memory array region 102 of the die 101 of the microelectronic device 100, such as one or more (e.g., each) of decoders (e.g., local deck decoders, row decoders), drivers (e.g., word line (WL) drivers), repair circuitry (e.g., row repair circuitry), memory test devices, MUX, ECC devices, and self-refresh/wear leveling devices.

The logic region 130 of the base structure 106 may be divided into multiple (e.g., a plurality of) logic sub-regions 134. At least some of the logic sub-regions 134 may include different types of logic devices than at least some other of the logic sub-regions 134. As a non-limiting example, one or more of the logic sub-regions 134 may be a pump sub-region including charge pumps (e.g., $V_{CCP}$ charge pumps, $V_{NEGWL}$ charge pumps, DVC2 charge pumps) therein. At least some other of the logic sub-regions 134 may be free of charge pumps therein. As another non-limiting example, one or more of the logic sub-regions 134 may be a driver sub-region including driver devices (e.g., string driver devices) therein. At least some other of the logic sub-regions 134 may be free of driver devices therein. As an additional non-limiting example, one or more of the logic sub-regions 134 may be a memory cache sub-region including buffer devices (e.g., page buffer devices) therein. At least some other of the logic sub-regions 134 may be free of buffer devices therein. As a further non-limiting example, one or more of the logic sub-regions 134 may be a decoder sub-region including decoder devices therein. At least some other of the logic sub-regions 134 may be free of decoder devices therein. As a yet further non-limiting example, one or more of the logic sub-regions 134 may be a sense amplifier sub-region including sense amplifier devices therein. At least some other of the logic sub-regions 134 may be free of sense amplifier devices therein.

With continued reference to FIG. 1A, the first conductive routing tier 108 may be vertically interposed between the base structure 106 and the stack structure 112. The first conductive routing structures 110 of the first conductive routing tier 108 may include at least one source structure 110A (e.g., a source plate) within the memory array region 102 of the die 101 of the microelectronic device 100, and contact pads 110B within the contact region 104 of the die 101 of the microelectronic device 100. The source structure(s) 110A and the contact pads 110B may horizontally neighbor one another (e.g., in the X-direction, in the Y-direction) within the first conductive routing tier 108. The source structure(s) 110A may be electrically isolated from the contact pads 110B, and may be positioned at substantially the same vertical position (e.g., in the Z-direction) as the contact pads 110B. At least one insulative material may be interposed between the source structure(s) 110A and the contact pads 110B of the first conductive routing tier 108.

The first conductive routing structures 110 (including the source structure(s) 110A and the contact pads 110B) of the first conductive routing tier 108 may each be formed of and include conductive material. In some embodiments, the first conductive routing structures 110 are formed of and include one or more of a metal, an alloy, and a conductive metal-containing material (e.g., a conductive metal nitride, a conductive metal silicide, a conductive metal carbide, a conductive metal oxide). As a non-limiting example, the first conductive routing structures 110 may be formed of and include W. In additional embodiments, the first conductive routing structures 110 are formed of and include conductively doped semiconductive material, such as a conductively doped form of one or more of a silicon material, such as monocrystalline silicon or polycrystalline silicon; a silicon-germanium material; a germanium material; a gallium arsenide material; a gallium nitride material; and an indium phosphide material. As a non-limiting example, the first conductive routing structures 110 may be formed of and include silicon (e.g., polycrystalline silicon) doped with at least one dopant (e.g., one or more of at least one n-type dopant, at least one p-type dopant, and at least another dopant).

At least some of the first conductive routing structures 110 of the first conductive routing tier 108 may individually be coupled to logic devices within the logic region 130 of the base structure 106. In addition, at least some of the first conductive routing structures 110 (e.g., the source structure(s) 110A) may also individually be coupled to the cell pillar structures 126 within the memory array region 102 of the die 101 of the microelectronic device 100. In some embodiments, the source structure(s) 110A of the first conductive routing tier 108 directly physically contact the cell pillar structures 126 within the memory array region 102 of the die 101 of the microelectronic device 100. In additional embodiments, contact structures vertically intervene between the source structure(s) 110A and at least some of the cell pillar structures 126. In addition, at least some of the first conductive routing structures 110 (e.g., at least some of the contact pads 110B) may individually be coupled to at least some of the contact structures 128 within the contact region 104 of the die 101 of the microelectronic device 100. In some embodiments, the contact pads 110B of the first conductive routing tier 108 directly physically contact the contact structures 128 coupled thereto. In additional embodiments, additional contact structures vertically intervene between at least some of the contact pads 110B and at least some of the contact structures 128 coupled thereto.

Still referring to FIG. 1A, the stack structure 112 of the die 101 of the microelectronic device 100 may be formed to vertically overlie the first conductive routing tier 108, and may include a vertically alternating (e.g., in the Z-direction) sequence of conductive structures 136 and insulative structures 138 arranged in tiers 140. Each of the tiers 140 of the stack structure 112 may include at least one of the conductive structures 136 vertically neighboring at least one of the insulative structures 138. The stack structure 112 may be formed to include any desired number of the tiers 140, such as greater than or equal to sixteen (16) of the tiers 140, greater than or equal to thirty-two (32) of the tiers 140, greater than or equal to sixty-four (64) of the tiers 140, greater than or equal to one hundred and twenty-eight (128) of the tiers 140, or greater than or equal to two hundred and fifty-six (256) of the tiers 140.

The conductive structures 136 of the tiers 140 of the stack structure 112 may be formed of and include conductive material. By way of non-limiting example, the conductive structures 136 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the conductive structures 136 are formed of and include W. Each of the conductive structures 136 may individually be substantially homogeneous, or one or more of the conductive structures 136 may individually be substantially heterogeneous. In some embodiments, each of the conductive structures 136 is formed to be substantially homogeneous. In additional embodiments, each of the conductive structures 136 is formed to be heterogeneous. Each conductive structures 136 may, for example, be formed of and include a stack of at least two different conductive materials.

At least one vertically lower (e.g., in the Z-direction) conductive structure 136 of the stack structure 112 may be employed as at least one first select gate (e.g., at least one source side select gate (SGS)) within the memory array region 102 of the die 101 of the microelectronic device 100. In some embodiments, a first conductive structure 136 of a vertically lowermost tier 140 of the stack structure 112 is employed as a first select gate (e.g., a SGS) within the memory array region 102. In addition, one or more vertically upper (e.g., in the Z-direction) conductive structure(s) 136 of the stack structure 112 may be employed as second select gate(s) (e.g., drain side select gate(s) (SGDs)) within the memory array region 102 of the die 101 of the microelectronic device 100. In some embodiments, horizontally neighboring (e.g., in the Y-direction) conductive structures 136 of a vertically uppermost tier 140 of the stack structure 112 are employed as second select gates (e.g., SGDs) within the memory array region 102.

Optionally, one or more liner materials(s) (e.g., insulative liner material(s), conductive liner material(s)) may also be formed around the conductive structures 136. The liner material(s) may, for example, be formed of and include one or more of a metal (e.g., titanium, tantalum), an alloy, a metal nitride (e.g., tungsten nitride, titanium nitride, tantalum nitride), and a metal oxide (e.g., aluminum oxide). In some embodiments, the liner material(s) comprise at least one conductive material employed as a seed material for the formation of the conductive structures 136. In some embodiments, the liner material(s) comprise titanium nitride. In further embodiments, the liner material(s) further include aluminum oxide. As a non-limiting example, aluminum oxide may be formed directly adjacent the insulative structures 138, titanium nitride may be formed directly adjacent the aluminum oxide, and tungsten may be formed directly adjacent the titanium nitride. For clarity and ease of understanding the description, the liner material(s) are not illustrated in FIG. 1A, but it will be understood that the liner material(s) may be disposed around the conductive structures 136.

The insulative structures 138 of the tiers 140 of the stack structure 112 may be formed of and include at least one insulative material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative structures 138 is formed of and includes a dielectric oxide material, such as $SiO_x$ (e.g., $SiO_2$). Each of the insulative structures 138 may individually be substantially homogeneous, may be substantially heterogeneous. In some embodiments, each of the insulative structures 138 is substantially homogeneous. In further embodiments, at least one of the insulative structures 138 is substantially heterogeneous. One or more of the insulative structures 138 may, for example, be formed of and include a stack (e.g., laminate) of at least two different insulative materials.

As shown in FIG. 1A, in some embodiments, the stack structure 112 does not substantially horizontally extend into the contact region 104 of the die 101 of the microelectronic device 100. Put another way, the contact region 104 may be substantially free of the stack structure 112 within a horizontal area thereof. In such embodiments, the contact structures 128 within the contact region 104 may vertically extend through and be horizontally surrounded by at least one additional insulative material (e.g., at least one dielectric oxide material, such as $SiO_x$; at least one dielectric nitride material, such as $SiN_y$) horizontally neighboring the stack structure 112. Within the contact region 104, the additional insulative material may, for example, vertically extend from and between the first conductive routing tier 108 and the second conductive routing tier 114. In additional embodiments, the stack structure 112 horizontally extends into the contact region 104 of the die 101 of the microelectronic device 100. In some such embodiments, at least some of the contact structures 128 within the contact region 104 may vertically extend through and be horizontally surrounded by stack structure 112.

With continued reference to FIG. 1A, the cell pillar structures 126 may vertically extend through the tiers 140 of the stack structure 112. The cell pillar structures 126 may each individually be formed of and include a stack of materials. By way of non-limiting example, each of the cell pillar structures 126 may be formed to include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a tunnel dielectric material, such as a second oxide dielectric material (e.g., $SiO_x$, such as $SiO_2$); a channel material, such as a semiconductive material (e.g., silicon, such as polycrystalline Si); and a dielectric fill material (e.g., a dielectric oxide, a dielectric nitride, air). The charge-blocking material may be formed on or over surfaces of the conductive structures 136 and the insulative structures 138 of the tiers 140 of stack structure 112 at least partially defining horizontal boundaries of the cell pillar structures 126; the charge-trapping material may be horizontally surrounded by the charge-blocking material; the tunnel dielectric material may be horizontally surrounded by the charge-trapping material; the channel material may be horizontally surrounded by the tunnel dielectric material; and the dielectric fill material may be horizontally surrounded by the channel material.

Intersections of the cell pillar structures 126 and the conductive structures 136 of the tiers 140 of the stack structure 112 may define vertically extending strings of memory cells 142 coupled in series with one another within the stack structure 112. In some embodiments, the memory cells 142 formed at the intersections of the conductive structures 136 and the cell pillar structures 126 within different tiers 140 of the stack structure 112 comprise so-called "MONOS" (metal-oxide-nitride-oxide-semiconductor) memory cells. In additional embodiments, the memory cells 142 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 142 comprise so-called "floating gate" memory cells including floating gates (e.g., metallic floating gates) as charge storage structures. The floating gates may horizontally intervene between central structures of the cell pillar structures 126 and the conductive structures 136 of the different tiers 140 of the stack structure 112. The vertically extending strings of memory cells 142 together form a memory array within the stack structure 112.

Still referring to FIG. 1A, the contact structures 128 within the contact region 104 of the die 101 of the microelectronic device 100 may be configured and positioned to electrically connect one or more feature(s) (e.g., structure(s), material(s), devices(s)) of the microelectronic device 100 vertically overlying the stack structure 112 with one or more additional feature(s) of the microelectronic device 100 vertically underlying the stack structure 112. For example, the contact structures 128 within the contact region 104 may electrically connect at least some of the first conductive routing structures 110 of the first conductive routing tier 108 vertically underlying the stack structure 112 to at least some of the second conductive routing structures 116 of the second conductive routing tier 114 vertically overlying the stack structure 112. The contact structures 128 may individually be formed of and include at least one conductive material. In some embodiments, the contact structures 128 are formed of and include W. In additional embodiments, the contact structures 128 are formed of and include conductively doped polycrystalline silicon.

In embodiments wherein the stack structure 112 horizontally extends into the contact region 104 of the die 101 of the microelectronic device 100, insulative liner structures substantially continuously extend over and substantially cover side surfaces of at least some of the contact structures 128. The insulative liner structures may be horizontally interposed between the contact structures 128 and the conductive structures 136 (and the insulative structures 138) of the tiers 140 of the stack structure 112. The insulative liner structures may be formed of and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In additional embodiments, such as embodiments wherein the stack structure 112 does not horizontally extend into the contact region 104 of the die 101 of the microelectronic device 100, insulative liner structures do not substantially continuously extend over and substantially cover side surfaces of the contact structures 128. In some such embodiments, the contact structures 128 directly physically contact and vertically extend through additional insulative material horizontally neighboring the stack structure 112.

Still referring to FIG. 1A, the second conductive routing tier 114 may be vertically interposed between the stack structure 112 and the third conductive routing tier 118. The second conductive routing structures 116 of the second conductive routing tier 114 may include digit line structures 116A (e.g., bit line structures, data line structures) within the memory array region 102 of the die 101 of the microelectronic device 100, and additional contact pads 116B within the contact region 104 of the die 101 of the microelectronic device 100. The digit line structures 116A and the additional contact pads 116B may horizontally neighbor one another (e.g., in the X-direction, in the Y-direction) within the second conductive routing tier 114. The digit line structures 116A may be electrically isolated from the additional contact pads 116B, and may be positioned at substantially the same vertical position (e.g., in the Z-direction) as the additional contact pads 116B. At least one insulative material may be interposed between the source structure(s) 110A and the contact pads 110B of the second conductive routing tier 114.

The second conductive routing structures 116 (including the digit line structures 116A and the additional contact pads 116B) of the second conductive routing tier 114 may each be formed of and include conductive material. In some embodiments, the second conductive routing structures 116 are formed of and include one or more of a metal, an alloy, and a conductive metal-containing material (e.g., a conductive metal nitride, a conductive metal silicide, a conductive metal carbide, a conductive metal oxide). As a non-limiting example, the second conductive routing structures 116 may be formed of and include W.

Some of the second conductive routing structures 116 (e.g., the digit line structures 116A) may individually be coupled to the cell pillar structures 126 within the memory array region 102 of the die 101 of the microelectronic device 100. In some embodiments, the digit line structures 116A of the second conductive routing tier 114 are in electrical communication with the cell pillar structures 126 within the memory array region 102 of the die 101 of the microelectronic device 100. Conductive contact structures may vertically intervene between and electrically connect the digit line structures 116A and at least some of the cell pillar structures 126. In addition, some of the second conductive routing structures 116 (e.g., at least some of the additional contact pads 116B) may individually be coupled to at least some of the contact structures 128 within the contact region 104 of the die 101 of the microelectronic device 100. In some embodiments, the additional contact pads 116B of the second conductive routing tier 114 are in electrical communication with the contact structures 128 within the contact region 104 of the die 101 of the microelectronic device 100. The additional contact pads 116B may directly physically contact the contact structures 128 coupled thereto, or further conductive contact structures may vertically intervene between and electrically connect the additional contact pads 116B and at least some of the contact structures 128.

With continued reference to FIG. 1A, within the third conductive routing tier 118 vertically overlying the second conductive routing tier 114, some of the third conductive routing structures 120 may be at least partially positioned within the memory array region 102 of the die 101 of the microelectronic device 100, and some other of the third conductive routing structures 120 may be positioned within the contact region 104 of the die 101 of the microelectronic device 100. As shown in FIG. 1A, at least some of the third conductive routing structures 120 may be electrically connected to at least some of the second conductive routing structures 116 (e.g., the digit line structures 116A, the additional contact pads 116B) of the second conductive routing tier 114 by way of contact structures 144.

The third conductive routing structures 120 of the third conductive routing tier 118 may each be formed of and include conductive material. In some embodiments, the third conductive routing structures 120 are formed of and include one or more of a metal, an alloy, and a conductive metal-containing material (e.g., a conductive metal nitride, a conductive metal silicide, a conductive metal carbide, a conductive metal oxide). As a non-limiting example, the third conductive routing structures 120 may be formed of and include Cu. As another a non-limiting example, the third conductive routing structures 120 may be formed of and include W.

While FIG. 1A depicts the die 101 of the microelectronic device 100 as including a single (e.g., only one) third conductive routing tier 118 including third conductive routing structures 120, the die 101 of the microelectronic device 100 may be formed to include multiple (e.g., more than one) third conductive routing tiers 118 each individually including a desired arrangement (e.g., pattern) of third conductive routing structures 120. By of non-limiting example, the die 101 of the microelectronic device 100 may be formed to include two or more (e.g., three or more) of the third conductive routing tiers 118, wherein different third conductive routing tiers 118 are vertically offset from one another and each individually include a desired arrangement of third conductive routing structures 120 therein. At least some of the third conductive routing structures 120 within at least one of the third conductive routing tiers 118 may be coupled to at least some of the third conductive routing structures 120 within at least one other of the third conductive routing tiers 118 by way of conductive interconnect structures.

Still referring to FIG. 1A, within the conductive pad tier 122 vertically overlying the third conductive routing tier 118, the conductive pads 124 (e.g., bond pads) may include first conductive pads 124A (e.g., first bond pads) positioned outside of horizontal boundaries (e.g., outside of a horizontal area) of the memory array region 102 of the die 101 of the microelectronic device 100, and second conductive pads 124B (e.g., second bond pads) positioned at and/or at least partially within the horizontal boundaries (e.g., at or at least partially within the horizontal area) of the memory array region 102 of the die 101 of the microelectronic device 100. Configurations and positions of the conductive pads 124 of the conductive pad tier 122, including configurations and positions of the first conductive pads 124A and the second conductive pads 124B, relative to one another and relative to other features of the microelectronic device 100 are described in further detail below.

As shown in FIG. 1A, the conductive pads 124 may be coupled to at least some of the third conductive routing structures 120 of the third conductive routing tier 118. At least some of the conductive pads 124, including at least some of the first conductive pads 124A and at least some of the second conductive pads 124B, may be configured to receive global signals from conductive wires 146 (e.g., bond wires) coupled thereto, and to relay the global signals to the third conductive routing structures 120 coupled thereto. By way of non-limiting example, the global signals may include one or more of power (e.g., supply power) signals (e.g., supply voltage ($V_{cc}$) signals, ground ($V_{ss}$) signals), data signals (e.g., input/output (I/O) signals), and control signals. In some embodiments, at least some of the conductive pads 124, including at least some of the first conductive pads 124A and at least some of the second conductive pads 124B, are employed as supply power pads (e.g., $V_{cc}$ pads, $V_{ss}$ pads) configured and positioned to receive power signals (e.g., $V_{cc}$ signals, $V_{ss}$ signals) from at least some of the conductive wires 146. In additional embodiments, one or more of the conductive pad(s) 124 are employed as one or more data signal pad(s) (e.g., I/O pad(s)) configured and positioned to receive data signals (e.g., I/O signals) from one or more of the conductive wire(s) 146. In further embodiments, one or more of the conductive pad(s) 124 are employed as one or more control pad(s) configured and positioned to receive control signals from one or more of the conductive wire(s) 146. The conductive wires 146 may be coupled to additional conductive contact structures 148 (e.g., leads) operatively associated with additional circuitry (e.g., external circuitry, such as external bus circuitry). In some embodiments, the additional conductive contact structures 148 are portions of a lead frame of a package (e.g., an electronic package, such as an integrated circuit (IC) package) including the microelectronic device 100 and additional features (e.g., a protective enclosure including non-conductive encapsulation materials). Although the microelectronic device 100 is described herein as being a part of a package, the microelectronic device 100 may include the entire package.

The conductive pads 124 (including the first conductive pads 124A and the second conductive pads 124B) of the conductive pad tier 122 may each be formed of and include conductive material. In some embodiments, the conductive pads 124 are formed of and include one or more of a metal, an alloy, and a conductive metal-containing material (e.g., a conductive metal nitride, a conductive metal silicide, a conductive metal carbide, a conductive metal oxide). As a non-limiting example, the conductive pads 124 may be formed of and include Al. As another non-limiting example, the conductive pads 124 may be formed of and include W.

Still referring to FIG. 1A, the first conductive pads 124A positioned outside of the horizontal boundaries (e.g., outside of the horizontal area) of the memory array region 102 of the die 101 of the microelectronic device 100 may be located within horizontal boundaries of the additional region 132 of the base structure 106 of the die 101 of the microelectronic device 100. In some embodiments, the first conductive pads 124A are substantially confined within the horizontal area of the additional region 132 of the base structure 106, such that the first conductive pads 124A are located completely outside of the horizontal area of the logic region 130 of the base structure 106.

Referring to FIG. 1B, configurations and operational functions of the first conductive pads 124A may be selected at least partially based on the logic sub-region(s) 134 of the logic region 130 relatively horizontally proximate (e.g., in the X-direction) to the first conductive pads 124A. By way of non-limiting example, if the logic sub-region 134 depicted in FIG. 1B comprises a pump sub-section including charge pumps ($V_{CCP}$ charge pumps, $V_{NEGWL}$ charge pumps, DVC2 charge pumps), at least some of the first conductive pads 124A positioned horizontally proximate (e.g., in the X-direction) thereto may comprise supply power pads (e.g., $V_{cc}$ pads, $V_{ss}$ pads) configured and positioned to receive power signals (e.g., $V_{cc}$ signals, $V_{ss}$ signals) from some of the conductive wires 146. For example, at least one of the first conductive pads 124A may comprise a $V_{cc}$ pad, and at least one other of the first conductive pads 124A may comprise a $V_{ss}$ pad. One or more of the first conductive pad(s) 124A employed as $V_{cc}$ pad(s) may be electrically connected to a voltage regulator device 150 (e.g., a direct current (DC) linear voltage regulator, such as a low-dropout (LDO) regulator). Conductive routing structures 152 may be employed to electrically connect at least some of the first conductive pads 124A to other features (e.g., structures, devices) of the microelectronic device 100 and/or a package including the microelectronic device 100, as desired. By way of non-limiting example, as depicted in FIG. 1B, some conductive routing structures 152 may extend between and couple one or more of the first conductive pad(s) 124A employed as $V_{cc}$ pad(s) to the voltage regulator device 150.

The first conductive pads 124A may each individually exhibit a desired horizontal cross-sectional shape. As shown in FIG. 1B, in some embodiments, each of the first conductive pads 124A exhibits a substantially regular (e.g., square) horizontal cross-sectional shape. In additional embodiments, one or more (e.g., each) of the first conductive pad(s) 124A exhibits a non-regular horizontal cross-sectional shape, such as one more of a circular cross-sectional shape, an oblong cross-sectional shape, an elliptical cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. In addition, each of the first conductive pads 124A may exhibit substantially the same horizontal cross-sectional dimensions (e.g., substantially the same horizontal width in the X-direction, and substantially the same horizontal length in the Y-direction), or at least one of the first conductive pads 124A may exhibit one or more different horizontal cross-sectional dimensions (e.g., a different horizontal width in the X-direction, and/or a different horizontal length in the Y-direction) than at least one other of the first conductive pads 124A. In some embodiments, all of the first conductive pads 124A exhibit substantially the same horizontal cross-sectional dimensions.

The first conductive pads 124A may be horizontally spaced apart from one another (e.g., in the Y-direction) by at least one pad spacing distance $B_1$. The pad spacing distance $B_1$ between two (2) first conductive pads 124A horizontally neighboring one another may at least partially depend on the configurations and functions of the two (2) first conductive pads 124A, as well as on the configurations and positions of the second conductive pad(s) 124B and the conductive wire(s) 146, if any, horizontally interposed (e.g., in the Y-direction) between the two (2) first conductive pads 124A. In some embodiments, the pad spacing distance $B_1$ is greater than or equal to about 15 micrometers (µm), such as greater than or equal to about 20 µm, within a range of from about 15 µm to about 50 µm, within a range of from about 15 µm to about 30 µm, within a range of from about 15 µm to about 25 µm, or within a range of from about 15 µm to about 20 µm. Each pair of horizontally neighboring first conductive pads 124A may be horizontally separated from one another by substantially the same pad spacing distance $B_1$, or at least one pair of horizontally neighboring first conductive pads 124A may be horizontally separated from one another by a different pad spacing distance $B_1$ (e.g., a greater pad spacing distance $B_1$, a smaller pad spacing distance $B_1$) than at least one other pair of horizontally neighboring first conductive pads 124A.

As shown in FIG. 1B, at least some (e.g., all) of the first conductive pads 124A may be substantially horizontally aligned with one another. For example, the first conductive pads 124A may be substantially horizontally aligned with one another within a row of the first conductive pads 124A. The row of the first conductive pads 124A may horizontally extend in the Y-direction, and horizontal center of the first conductive pads 124A within the row may be substantially horizontally aligned with one another in the X-direction perpendicular to the Y-direction. In additional embodiments, at least one of the first conductive pads 124A is at least partially horizontally offset from (e.g., at least partially horizontally misaligned with) at least one other of the first conductive pads 124A in the X-direction. For example, a horizontal center of at least one of the first conductive pads 124A in the X-direction may be horizontally offset from a horizontal center of at least one other of the first conductive pads 124A in the X-direction.

Each of the first conductive pads 124A may individually be coupled to one of the conductive wires 146, or at least one of the first conductive pads 124A may not be coupled to one of the conductive wires 146. If an individual first conductive pad 124A is coupled to an individual conductive wire 146, the first conductive pads 124A may be physically attached (e.g., bonded) to the conductive wire 146 by desired means. In some embodiments, at least some of the first conductive pads 124A are bonded to at least some of the conductive wires 146 by intervening conductive connection structures 154. The conductive connection structures 154 may, for example, comprise solder structures, such as one or more of solder balls and solder bumps.

Still referring to FIG. 1B, the second conductive pads 124B positioned at and/or at least partially within the horizontal boundaries (e.g., at or at least partially within the horizontal area) of the memory array region 102 of the die 101 of the microelectronic device 100 may be located at least partially within horizontal boundaries of the logic region 130 of the base structure 106 of the die 101 of the microelectronic device 100. In some embodiments, the second conductive pads 124B are substantially confined within the horizontal area of the logic region 130 of the base structure 106, such that the second conductive pads 124B are located completely outside of the horizontal area of the additional region 132 of the base structure 106. Horizontal boundaries (e.g., in the X-direction) of the second conductive pads 124B most horizontally proximate to the first conductive pads 124A may be located at or relatively proximate to (e.g., relatively close to) horizontal boundaries (e.g., in the X-direction) of the logic region 130. In some embodiments, the second conductive pads 124B are substantially confined within a horizontal area of the memory array region 102 of the die 101. As shown in FIG. 1A, the second conductive pads 124B may at least partially (e.g., substantially) horizontally overlap (e.g., in the X-direction) the stack structure 112. In some embodiments, the second conductive pads 124B at least partially horizontally overlap (e.g., in the X-direction) some of the cell pillar structures 126 vertically extending through the stack structure 112.

Referring again to FIG. 1B, at least some of the second conductive pads 124B may individually be located at least partially (e.g., substantially) within horizontal area(s) of one or more of the logic sub-region(s) 134 of the logic region 130 located relatively horizontally proximate to the additional region 132 of the base structure 106. In some embodiments, one or more (e.g., each) of the second conductive pads 124B is substantially confined within a horizontal area of at least one logic sub-region 134 located proximate an outer horizontal boundary (e.g., in the X-direction) of the logic region 130. In additional embodiments, for at least one (e.g., each) of the second conductive pads 124B, a portion of the second conductive pad 124B is positioned within a horizontal area of a logic sub-region 134 located proximate an outer horizontal boundary (e.g., in the X-direction) of the logic region 130, and an additional portion of the second conductive pad 124B is positioned outside of the horizontal area of the logic sub-region 134. The additional portion of the second conductive pad 124B may still be positioned within a horizontal area of the logic region 130 containing the logic sub-region 134, or may be positioned outside of the horizontal area of the logic region 130.

Configurations and operational functions of the second conductive pads 124B may be selected at least partially based on the logic sub-region(s) 134 of the logic region 130 that the second conductive pads 124B horizontally overlap or are located relatively horizontally proximate (e.g., in the X-direction) to. By way of non-limiting example, if the logic sub-region 134 depicted in FIG. 1B comprises a pump sub-section including charge pumps ($V_{CCP}$ charge pumps, $V_{NEGWL}$ charge pumps, DVC2 charge pumps), at least some of the second conductive pads 124B horizontally overlapping and/or located relatively horizontally proximate to the logic sub-region 134 may comprise supply power pads (e.g., $V_{cc}$ pads, $V_{ss}$ pads) configured and positioned to receive power signals (e.g., $V_{cc}$ signals, $V_{ss}$ signals) from some of the conductive wires 146. For example, at least one of the second conductive pads 124B may comprise a $V_{cc}$ pad, and at least one other of the second conductive pads 124B may comprise a $V_{ss}$ pad. One or more of the second conductive pad(s) 124B employed as $V_{cc}$ pad(s) may be electrically connected to the voltage regulator device 150. Some of the conductive routing structures 152 may be employed to electrically connect at least some the second conductive pads 124B to other features (e.g., structures, devices) of the microelectronic device 100 and/or a package including the microelectronic device 100, as desired. By way of non-limiting example, as depicted in FIG. 1B, some conductive routing structures 152 may extend between and couple one or more of the second conductive pad(s) 124B employed as $V_{cc}$ pad(s) to the voltage regulator device 150.

In some embodiments, operational functions of at least some of the second conductive pads 124B correspond to (e.g., are substantially the same as) operational functions of at least some of the first conductive pads 124A located most horizontally proximate thereto. By way of non-limiting example, if one or more of the first conductive pad(s) 124A comprise supply power pad(s) (e.g., $V_{cc}$ pad(s), $V_{ss}$ pad(s)), one or more of the second conductive pad(s) 124B located most horizontally proximate to the one or more of the first conductive pad(s) 124A may also comprise supply power pad(s) (e.g., $V_{cc}$ pad(s), $V_{ss}$ pad(s)). In some embodiments, one or more of the second conductive pad(s) 124B employed as $V_{cc}$ pad(s) are positioned relatively horizontally proximate to one or more of the first conductive pad(s) 124A also employed as $V_{cc}$ pad(s); and one or more of the second conductive pad(s) 124B employed as $V_{ss}$ pad(s) are positioned relatively horizontally proximate to one or more of the first conductive pad(s) 124A also employed as $V_{ss}$ pad(s). Positioning first conductive pad(s) 124A and second conductive pad(s) 124B having corresponding operational functions relatively horizontally proximate one another may facilitate redundancy for performance of the operational functions to ensure device reliability.

The second conductive pads 124B may each individually exhibit a desired horizontal cross-sectional shape. As shown in FIG. 1B, in some embodiments, each of the second conductive pads 124B exhibits a substantially regular (e.g., square) horizontal cross-sectional shape. In additional embodiments, one or more (e.g., each) of the second conductive pad(s) 124B exhibits a non-regular horizontal cross-sectional shape, such as one more of a circular cross-sectional shape, an oblong cross-sectional shape, an elliptical cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. In addition, each of the second conductive pads 124B may exhibit substantially the same horizontal cross-sectional dimensions (e.g., substantially the same horizontal width in the X-direction, and substantially the same horizontal length in the Y-direction), or at least one of the second conductive pads 124B may exhibit one or more different horizontal cross-sectional dimensions (e.g., a different horizontal width in the X-direction, and/or a different horizontal length in the Y-direction) than at least one other of the second conductive pads 124B. In some embodiments, all of the second conductive pads 124B exhibit substantially the same horizontal cross-sectional dimensions.

A horizontal cross-sectional shape of each of the second conductive pads 124B may be substantially the same as a horizontal cross-sectional shape of each of the first conductive pads 124A, or one or more horizontal cross-sectional shape(s) of the second conductive pads 124B may be different than one or more horizontal cross-sectional shape(s) of the first conductive pads 124A. In addition, the horizontal cross-sectional dimensions of each of the second conductive pads 124B may be substantially the same as the horizontal cross-sectional dimensions (e.g., substantially the same horizontal width in the X-direction, and substantially the same horizontal length in the Y-direction) of each of the first conductive pads 124A, or one or more of the second conductive pad(s) 124B may exhibit one or more different horizontal cross-sections dimensions (e.g., a different horizontal width in the X-direction, and/or a different horizontal length in the Y-direction) that than one or more of the first conductive pad(s) 124A.

The second conductive pads 124B may be horizontally spaced apart from one another (e.g., in the Y-direction) by at least one additional pad spacing distance $C_1$. The additional pad spacing distance $C_1$ between two (2) second conductive pads 124B horizontally neighboring one another may at least partially depend on the configurations and functions of the two (2) second conductive pads 124B, as well as on the configurations and positions of the first conductive pad(s) 124A and the conductive wire(s) 146, if any, horizontally interposed (e.g., in the Y-direction) between the two (2) second conductive pads 124B. In some embodiments, the additional pad spacing distance $C_1$ is greater than or equal to about 15 μm, such as greater than or equal to about 20 μm, within a range of from about 15 μm to about 50 μm, within a range of from about 15 μm to about 30 μm, within a range of from about 15 μm to about 25 μm, or within a range of from about 15 μm to about 20 μm. Each pair of horizontally neighboring second conductive pads 124B may be horizontally separated from one another by substantially the same additional pad spacing distance $C_1$, or at least one pair of horizontally neighboring second conductive pads 124B may be horizontally separated from one another by a different additional pad spacing distance $C_1$ (e.g., a greater additional pad spacing distance $C_1$, a smaller additional pad spacing distance $C_1$) than at least one other pair of horizontally neighboring second conductive pads 124B. The additional pad spacing distance $C_1$ between all horizontally neighboring second conductive pads 124B may be substantially the same as (e.g., substantially equal to) the pad spacing distance $B_1$ between all horizontally neighboring first conductive pads 124A, or the additional pad spacing distance $C_1$ between at least two (2) horizontally neighboring second conductive pads 124B may be different than (e.g., less than, greater than) the pad spacing distance $B_1$ between at least two (2) horizontally neighboring first conductive pads 124A. Conductive routing structures (e.g., signal routing structures) of the microelectronic device 100 may be positioned within (e.g., partially positioned within) and may extend (e.g., horizontally extend, vertically extend) through the space between horizontally neighboring second conductive pads 124B.

Still referring to FIG. 1B, the second conductive pads 124B may be horizontally spaced apart from the first conductive pads 124A (e.g., in the X-direction) by at least one further pad spacing distance $D_1$. The further pad spacing distance $D_1$ between at least one of the second conductive pads 124B and at least one of the first conductive pads 124A horizontally neighboring (e.g., in the X-direction) the second conductive pad 124B may be greater than or equal to the pad spacing distance $B_1$ between the at least one of the first conductive pad 124A and at least one other of the first conductive pads 124A horizontally neighboring (e.g., in the Y-direction) the at least one of the first conductive pads 124A. In some embodiments, the further pad spacing distance $D_1$ is greater than or equal to about 15 µm, such as greater than or equal to about 20 µm, within a range of from about 15 µm to about 50 µm, within a range of from about 15 µm to about 30 µm, within a range of from about 15 µm to about 25 µm, or within a range of from about 15 µm to about 20 µm. Each second conductive pad 124B may be horizontally separated from each first conductive pad 124A horizontally neighboring the second conductive pad 124B by substantially the same further pad spacing distance $D_1$, or at least one of the second conductive pads 124B may be horizontally separated from at least one of the first conductive pads 124A horizontally neighboring the at least one of the second conductive pads 124B by a different further pad spacing distance $D_1$ (e.g., a greater further pad spacing distance $D_1$, a smaller further pad spacing distance $D_1$) than that between at least one other of the second conductive pads 124B and at least one other of the first conductive pads 124A horizontally neighboring the at least one other of the second conductive pads 124B.

As shown in FIG. 1B, at least some (e.g., all) of the second conductive pads 124B may be substantially horizontally aligned with one another. For example, the second conductive pads 124B may be substantially horizontally aligned with one another within a row of the second conductive pads 124B. The row of the second conductive pads 124B may horizontally extend in the Y-direction, and horizontal centers of the second conductive pads 124B within the row may be substantially horizontally aligned with one another in the X-direction perpendicular to the Y-direction. The row of the second conductive pads 124B may horizontally extend substantially parallel to a row of the first conductive pads 124A. In additional embodiments, at least one of the second conductive pads 124B is at least partially horizontally offset from (e.g., at least partially horizontally misaligned with) at least one other of the second conductive pads 124B in the X-direction. For example, a horizontal center of at least one of the second conductive pads 124B in the X-direction may be horizontally offset from a horizontal center of at least one other of the second conductive pads 124B in the X-direction.

One or more (e.g., each) of the second conductive pad(s) 124B may be at least partially horizontally offset in the Y-direction from one or more (e.g., each) of the first conductive pad(s) 124A most horizontally proximate (e.g., horizontally closest) thereto. For example, a horizontal center of at least one of the second conductive pads 124B horizontally offset in the Y-direction may be from a horizontal center of at least one first conductive pad 124A most horizontally proximate thereto. Horizontal centers of all of the second conductive pads 124B may be horizontally offset in the Y-direction from horizontal centers of all of the first conductive pads 124A, or a horizontal center of at least one of the second conductive pads 124B may be substantially aligned in the Y-direction with a horizontal center of at least one of the first conductive pads 124A. As shown in FIG. 1B, in some embodiments, at least one (e.g., each) of the second conductive pads 124B partially horizontally overlaps, in the Y-direction, at least one (e.g., each) of the first conductive pads 124A horizontally neighboring the at least one of the second conductive pads 124B. In additional embodiments, at least one (e.g., each) of the second conductive pads 124B does not horizontally overlap, in the Y-direction, at least one (e.g., each) of the first conductive pads 124A horizontally neighboring the at least one of the second conductive pads 124B. Put another way, the at least one of the second conductive pads 124B may be completely horizontally offset in the Y-direction from the at least one of the first conductive pads 124A horizontally neighboring the at least one of the second conductive pads 124B.

Each of the second conductive pads 124B may individually be coupled to one of the conductive wires 146, or at least one of the second conductive pads 124B may not be coupled to one of the conductive wires 146. If an individual second conductive pads 124B is coupled to an individual conductive wire 146, the second conductive pads 124B may be physically attached (e.g., bonded) to the conductive wire 146. In some embodiments, at least some of the second conductive pads 124B are bonded to at least some of the conductive wires 146 by at least some of the conductive connection structures 154 (e.g., solder structures, such as one or more of solder balls and solder bumps).

Still referring to FIG. 1B, the conductive wires 146 (e.g., bond wires) coupled to the conductive pads 124 (e.g., including the first conductive pads 124A and the second conductive pad 124B thereof) may be horizontally spaced apart from one another (e.g., in the Y-direction) by at least one wire spacing distance $E_1$. The wire spacing distance $E_1$ between two (2) conductive wires 146 horizontally neighboring one another may at least partially depend on the configurations of the two (2) conductive wires 146, and on the configurations and positions of the two (2) conductive pads 124 (e.g., one (1) first conductive pad and one (1) second conductive pad 124B, two (2) first conductive pads 124A, two (2) first conductive pads 124A) attached (e.g., bonded) to the two (2) conductive wires 146 (e.g., by way of two (2) of the conductive connection structures 154). Each pair of horizontally neighboring conductive wires 146 may be horizontally separated from one another by substantially the same wire spacing distance $E_1$, or at least one pair of horizontally neighboring conductive wires 146 may be horizontally separated from one another by a different wire spacing distance $E_1$ (e.g., a greater wire spacing distance $E_1$, a smaller wire spacing distance $E_1$) than at least one other pair of horizontally neighboring conductive wires 146. In some embodiments, the wire spacing distance $E_1$ between one of the conductive wires 146 coupled to one of the first conductive pads 124A and one other of the conductive wires 146 coupled to one of the second conductive pads 124B horizontally neighboring the one of the first conductive pads 124A is about one-half (½) of a relatively larger distance between the one of the conductive wires 146 and yet one other of the conductive wires 146 coupled to one other of the first conductive pads 124A horizontally neighboring the one of the first conductive pads 124A.

Figure 2:
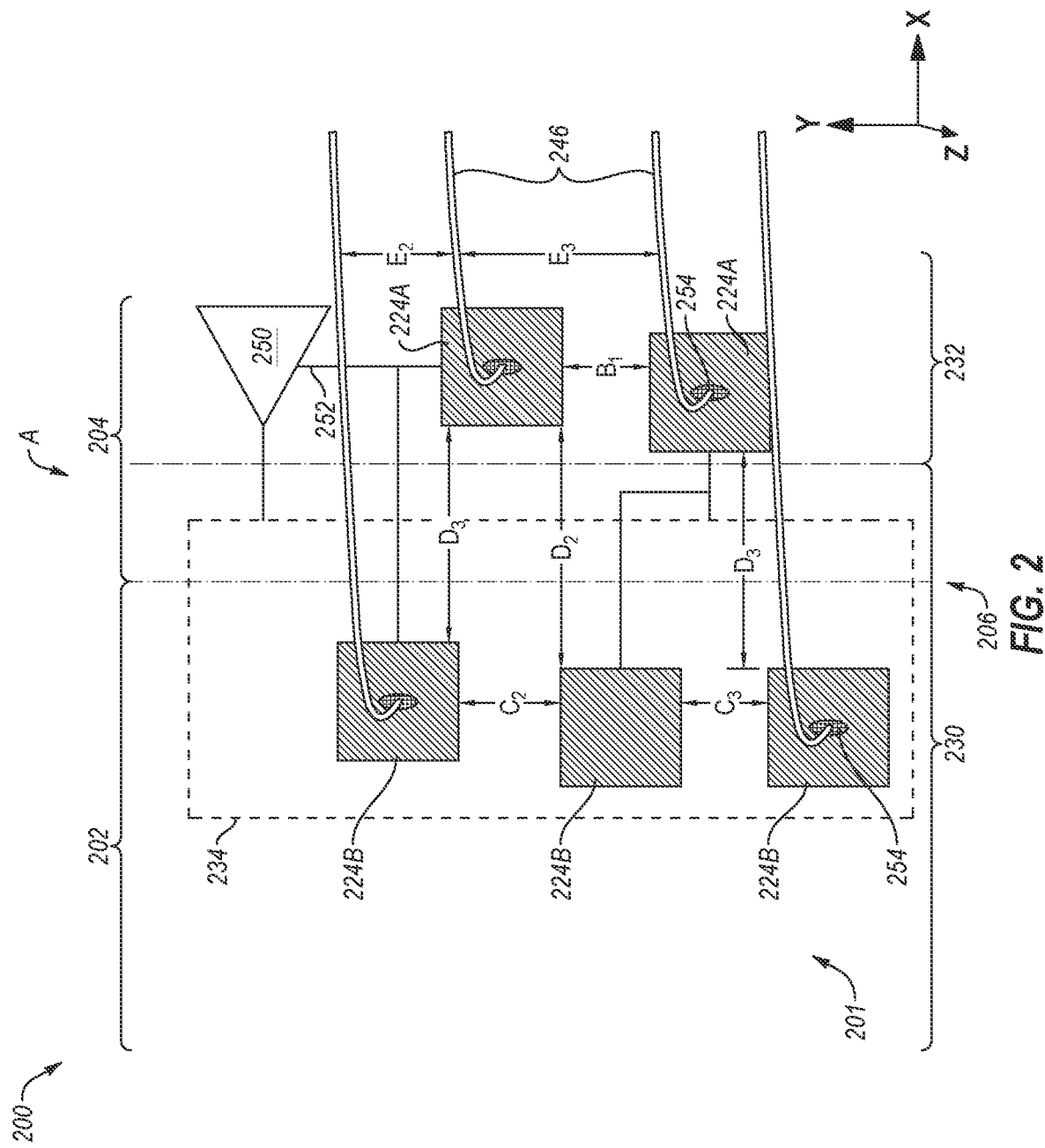
FIG. 2 is a simplified, partial top-down view of a portion of a microelectronic device, in accordance with additional embodiments of the disclosure.

As previously described, the microelectronic device 100 may be formed to exhibit a different configuration than that depicted in FIGS. 1A and 1B. By way of non-limiting example, FIG. 2 shows a simplified, partial top-down view of a portion A of a microelectronic device 200, in accordance with additional embodiments of the disclosure. The portion A of the microelectronic device 200 may correspond to the portion A of the microelectronic device 100 previously described with reference to FIGS. 1A and 1B, but may exhibit different configurations of features within a horizontal area thereof as compared to the portion A of the microelectronic device 100. Throughout FIG. 2 and the associated description, functionally similar features (e.g., materials, structures, devices) are referred to with similar reference numerals incremented by 100. To avoid repetition, not all features shown in FIG. 2 are described in detail herein. Rather, unless described otherwise below, a feature in FIG.

2 designated by a reference numeral that is a 100 increment of the reference numeral of a feature previously described with reference to one or more of FIGS. 1A and 1B will be understood to be substantially similar to the previously described feature. As a non-limiting example, unless described otherwise below, features designated by the reference numeral 224A in FIG. 2 will be understood to be substantially similar to the first conductive pads 124A previously described herein with reference to FIGS. 1A and 1B. As another non-limiting example, unless described otherwise below, features designated by the reference numeral 224B in FIG. 2 will be understood to be substantially similar to the second conductive pads 124B previously described herein with reference to FIGS. 1A and 1B. In addition, unless described otherwise below, features of the microelectronic device 100 previously described with reference to FIG. 1A may also be included, in substantially the same manner (e.g., so as to exhibit substantially similar configurations and positions), within the microelectronic device 200 described herein with reference to FIG. 2.

As depicted in FIG. 2, a configuration of the microelectronic device 200 may be similar to the configuration of the microelectronic device 100 previously described with reference to FIGS. 1A and 1B, except that the microelectronic device 200 may exhibit different configurations and/or positions of one or more of at least some of the first conductive pads 224A (e.g., first bond pads), at least some of the second conductive pads 224B (e.g., second bond pads), and at least some of the conductive wires 246 (e.g., bond wires) as compared to configurations and/or positions of the first conductive pads 124A (FIGS. 1A and 1B), the second conductive pads 124B (FIGS. 1A and 1B), and the conductive wires 146 (FIGS. 1A and 1B), respectively. The first conductive pads 224A, the second conductive pads 224B, and the conductive wires 246 of the microelectronic device 200, including non-limiting examples of potential configurations and potential positions thereof, are described in further detail below.

As shown in FIG. 2, one or more of the second conductive pad(s) 224B may be positioned at different locations in the X-direction than one or more other of the second conductive pad(s) 224B. For example, one or more of the second conductive pad(s) 224B may be horizontally positioned, in the X-direction, relatively farther away from the additional region 232 (and, hence, relatively farther into the logic region 230) of the base structure 206. For example, one or more (e.g., two or more) of the second conductive pad(s) 224B may be located at one or more different position(s) in the X-direction within one or more of the logic sub-region(s) 234 (e.g., a pump sub-region, a driver sub-region, a memory cache sub-region, a decoder sub-region, a sense amplifier sub-region) of the logic region 230 than one or more other of the second conductive pads 224B. In some embodiments, one or more (e.g., two or more) of the second conductive pad(s) 224B are horizontally offset in the X-direction from one or more other of the second conductive pad(s) 224B, such that the one or more of the second conductive pad(s) 224B are positioned relatively closer to a horizontal center in the X-direction of an individual logic sub-region 234 of the logic region 230 than the one or more other of the second conductive pad(s) 224B.

Horizontal centers of at least two of the second conductive pads 224B may be substantially horizontally aligned with one another in the X-direction, and may each be horizontally offset in the X-direction from a horizontal center of at least one other of the second conductive pads 224B. In some embodiments, at least two of the second conductive pads 224B that are substantially horizontally aligned with one another in the X-direction horizontally neighbor one another in the Y-direction. In additional embodiments, at least two of the second conductive pads 224B that are substantially horizontally aligned with one another in the X-direction do not horizontally neighbor one another in the Y-direction. For example, at least one other of the second conductive pads 224B having a horizontal center offset in the X-direction from horizontal centers of the at least two of the second conductive pads 224B may be horizontally interposed between the at least two of the second conductive pads 224B in the Y-direction. In further embodiments, a horizontal center of each of the second conductive pads 224B is horizontally offset in the X-direction from a horizontal center of each other of the second conductive pads 224B.

Still referring to FIG. 2, at least one of the second conductive pads 224B may be horizontally spaced apart (e.g., in the Y-direction) from at least one other of the second conductive pads 224B by a first additional pad spacing distance $C_2$ different than (e.g., greater than, less than) a second additional pad spacing distance $C_3$ between the at least one of the second conductive pads 224B and at least one more of the second conductive pads 224B. For example, a horizontal center in the Y-direction of the at least one of the second conductive pads 224B may be located relatively closer to a horizontal center in the Y-direction of the at least one more of the second conductive pads 224B than to a horizontal center in the Y-direction of the at least one other of the second conductive pads 224B, such that the first additional pad spacing distance $C_2$ is greater than the second additional pad spacing distance $C_3$. As shown in FIG. 2, in some such embodiments, the at least one of the second conductive pads 224B horizontally overlaps, in the Y-direction, one of a pair of horizontally neighboring first conductive pads 224A to a greater extent than one other of the pair of horizontally neighboring first conductive pads 224A. In additional embodiments, the at least one of the second conductive pads 224B does not horizontally overlap, in the Y-direction, one of a pair of horizontally neighboring first conductive pads 224A most horizontally proximate to the at least one of the second conductive pads 224B to a greater extent than one other of the pair of horizontally neighboring first conductive pads 224A. In some embodiments, the first additional pad spacing distance $C_2$ and the second additional pad spacing distance $C_3$ are each individually greater than or equal to about 15 µm, such as greater than or equal to about 20 µm, within a range of from about 15 µm to about 50 µm, within a range of from about 15 µm to about 30 µm, within a range of from about 15 µm to about 25 µm, or within a range of from about 15 µm to about 20 µm.

With continued reference to FIG. 2, one or more of the first conductive pad(s) 224A may be positioned at different locations in the X-direction than one or more other of first conductive pad(s) 224A. For example, one or more of the first conductive pad(s) 224A may be horizontally positioned, in the X-direction, relatively closer to the logic region 230 of the base structure 206. In some embodiments, the first conductive pads 224A are each positioned within a horizontal area of the additional region 232 of the base structure 206, but one or more of the first conductive pad(s) 224A are located relatively closer to a horizontal boundary of the logic region 230 of the base structure 206 than one or more other of the first conductive pads(s) 224A. In additional embodiments, one or more of the first conductive pads(s) 224A are partially positioned within a horizontal area of the additional region 232 of the base structure 206 and are also partially positioned within a horizontal area of the logic region 230 of the base structure 206; and one or more other of the first conductive pad(s) 224A are not partially positioned within the horizontal area of the logic region 230 of the base structure 206 (e.g., are confined with the horizontal area of the additional region 232 of the base structure 206). If an individual first conductive pad 224A horizontally extends into the horizontal area of the logic region 230 of the base structure 206, the first conductive pad 224A may be partially positioned within a horizontal area of a logic sub-region 234 (e.g., a pump sub-region, a driver sub-region, a memory cache sub-region, a decoder sub-region, a sense amplifier sub-region) within the logic region 230, or may not be partially positioned within a horizontal area of a logic sub-region 234 within the logic region 230. In some embodiments, one or more of the first conductive pad(s) 224A are horizontally offset in the X-direction from one or more other of the first conductive pad(s) 224A, such that the one or more of the first conductive pad(s) 224A are positioned relatively closer to a horizontal center in the X-direction of an individual logic sub-region 234 of the logic region 230 than the one or more other of the first conductive pad(s) 224A. As show in FIG. 2, in some such embodiments, one or more of the second conductive pad(s) 224B horizontally neighboring the one or more of the first conductive pad(s) 224A are positioned relatively closer to the horizontal center in the X-direction of the individual logic sub-region 234 of the logic region 230 than one or more other of the second conductive pad(s) 224B.

Horizontal centers of some of the first conductive pads 224A may be substantially horizontally aligned with one another in the X-direction, and may be horizontally offset in the X-direction from horizontal centers of one or more other of the first conductive pad(s) 224A. In some embodiments, at least two of the first conductive pads 224A that are substantially horizontally aligned with one another in the X-direction horizontally neighbor one another in the Y-direction. In additional embodiments, at least two of the first conductive pads 224A that are substantially horizontally aligned with one another in the X-direction do not horizontally neighbor one another in the Y-direction. For example, at least one other of the first conductive pads 224A having a horizontal center offset in the X-direction from horizontal centers of the at least two of the first conductive pads 224A may be horizontally interposed between the at least two of the first conductive pads 224A in the Y-direction. In further embodiments, a horizontal center of each of the first conductive pads 224A is horizontally offset in the X-direction from a horizontal center of each other of the first conductive pads 224A. In yet further embodiments, a horizontal center of each of the first conductive pads 224A is horizontally aligned in the X-direction with horizontal center of each other of the first conductive pads 224A.

Still referring to FIG. 2, at least one of the first conductive pads 224A may be horizontally spaced apart in the X-direction from at least one of the second conductive pads 224B by a first further pad spacing distance $D_2$ different than (e.g., greater than, less than) a second further pad spacing distance $D_3$ between at least one other of the first conductive pads 224A and the at least one of the second conductive pads 224B. For example, a horizontal center in the X-direction of the at least one other of the first conductive pads 224A may be located relatively closer to a horizontal center in the X-direction of the at least one of the second conductive pads 224B as compared to a horizontal center in the X-direction of the at least one of the first conductive pads 224A, such that the first further pad spacing distance $D_2$ is greater than the second further pad spacing distance $D_3$. As shown in FIG. 2, in some embodiments, the at least one of the first conductive pads 224A is horizontally spaced apart in the X-direction from at least one other of the second conductive pads 224B by the second further pad spacing distance $D_3$. In some embodiments, the first further pad spacing distance $D_2$ and the second further pad spacing distance $D_3$ are each individually greater than or equal to about 15 μm, such as greater than or equal to about 20 μm, within a range of from about 15 μm to about 50 μm, within a range of from about 15 μm to about 30 μm, within a range of from about 15 μm to about 25 μm, or within a range of from about 15 μm to about 20 μm.

As depicted in FIG. 2, in some embodiments, at least one (but not each) of the second conductive pads 224B is not coupled to any of the conductive wires 246. The at least one of the second conductive pads 224B may be free of a conductive connection structure 254 thereon. A first wire spacing distance $E_2$ between a pair of horizontally neighboring conductive wires 246 operatively associated with one of the first conductive pads 124A and one the second conductive pads 224B may be different than (e.g., less than, greater than) a second wire spacing distance $E_3$ between another pair of horizontally neighboring conductive wires 246 operatively associated with a pair of the first conductive pads 124A. In additional embodiments, at least one (but not each) of the first conductive pads 224A is not coupled to any of the conductive wires 246. The at least one of the first conductive pads 224A may be free of a conductive connection structure 254 thereon.

Thus, in accordance with embodiments of the disclosure, a microelectronic device comprises a base structure, a memory array overlying the base structure, and a conductive pad tier overlying the memory array. The base structure comprises a logic region including logic devices. The memory array comprises vertically extending strings of memory cells within a horizontal area of the logic region of the base structure. The conductive pad tier comprises first conductive pads substantially outside of the horizontal area of the logic region of the base structure, and second conductive pads horizontally neighboring the first conductive pads and within the horizontal area of the logic region of the base structure.

Furthermore, in accordance with embodiments of the disclosure, a memory device comprises a base structure, a conductive routing tier, a stack structure, a memory array, an additional conductive routing tier, conductive contacts, first conductive pads, and second conductive pads. The base structure comprises a region comprising complementary metal-oxide-semiconductor (CMOS) circuitry, and an additional region horizontally neighboring the region and substantially free of the CMOS circuitry. The conductive routing tier overlies the base structure. The stack structure overlies the conductive routing tier and comprises conductive material and insulative material vertically alternating with the conductive material. The memory array comprises strings of memory cells extending through the stack structure. The memory array is within a horizontal area of the region of the base structure. The additional conductive routing tier overlies the stack structure. The conductive contacts are horizontally offset from the memory array and extend between the conductive routing tier and the additional conductive routing tier. The first conductive pads overlie the additional conductive routing tier and are within a horizontal area of the additional region of the base structure. The first conductive pads are in electrical communication with some of the conductive contacts. The second conductive pads overlie the additional conductive routing tier and are horizontally interposed between the first conductive pads and at least some of the strings of memory cells of the memory array. The second conductive pads are in electrical communication with some other of the conductive contacts.

Figure 3:
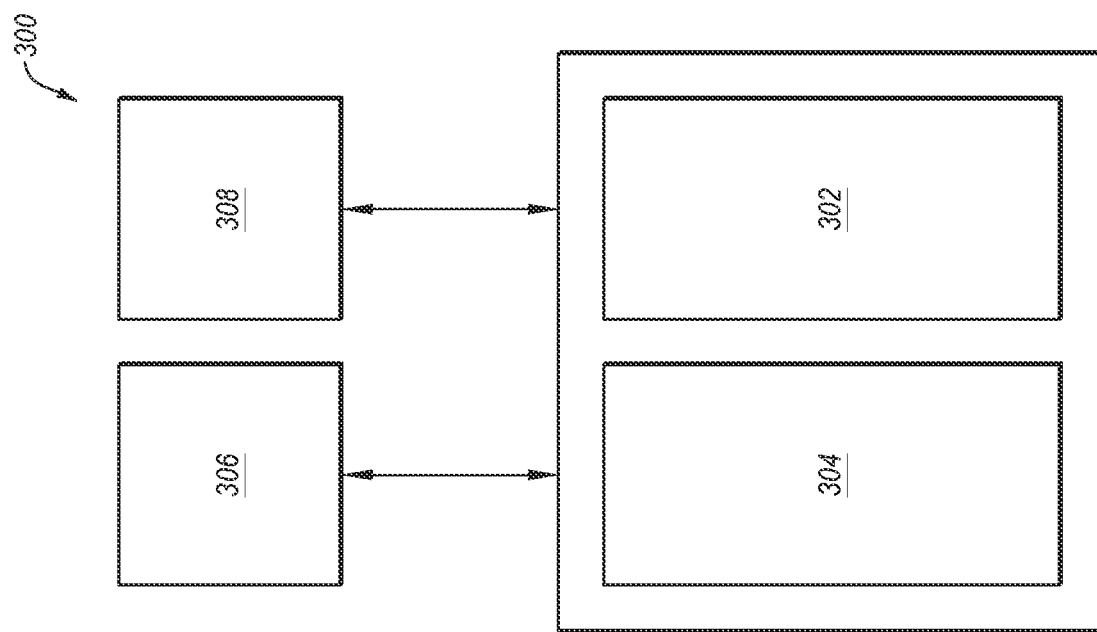
FIG. 3 is a schematic block diagram of an electronic system, in accordance with embodiments of the disclosure.

Microelectronic devices (e.g., the microelectronic devices 100, 200) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, a microelectronic device (e.g., the microelectronic devices 100, 200) previously described herein. The electronic system 300 may further include at least one electronic signal processor device 304 (often referred to as a "microprocessor"). The electronic signal processor device 304 may, optionally, include a microelectronic device (e.g., the microelectronic devices 100, 200) previously described herein. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include a microelectronic device (e.g., the microelectronic devices 100, 200) previously described herein. The electronic system 300 may further include one or more input devices(s) 306 for inputting information into the electronic system 300 by a user, such as, for example, a mouse or other pointing device, a keyboard, a touchpad, a button, or a control panel. The electronic system 300 may further include one or more output device(s) 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably connected to the input device and the output device, and a memory device operably connected to the processor device. The memory device comprises a stack structure, a base structure, a memory array, and bond pads. The stack structure comprises conductive structures vertically interleaved with insulative structures. The base structure vertically underlies the stack structure and comprises a logic region including logic circuitry. The memory array comprises strings of memory cells vertically extending through the stack structure. The memory array is positioned within a horizontal area of the logic region of the base structure. The bond pads vertically overlying the stack structure are in electrical communication with the logic circuitry. The bond pads comprise first bond pads and second bond pads. The first bond pads are positioned outside of the horizontal area of the logic region of the base structure. The second bond pads are positioned within of the horizontal area of the logic region of the base structure.

The structures and devices of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures and devices of the disclosure may also improve scalability, efficiency, and simplicity as compared to conventional structures and conventional devices.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A microelectronic device, comprising:
a base structure comprising a logic region including logic devices;
a memory array overlying the base structure and comprising vertically extending strings of memory cells within a horizontal area of the logic region of the base structure; and
a conductive pad tier overlying the memory array and comprising:
first conductive pads substantially outside of the horizontal area of the logic region of the base structure; and
second conductive pads horizontally neighboring the first conductive pads and within the horizontal area of the logic region of the base structure.

2. The microelectronic device of claim 1, wherein:
the second conductive pads are each at least partially within a horizontal area of a memory array region including the memory array therein, the second conductive pads at least partially horizontally overlap some of the strings of memory cells vertically extending through the memory array; and
the first conductive pads are each substantially outside of the horizontal area of the memory array region.

3. The microelectronic device of claim 2, further comprising conductive contact structures overlying the base structure and within a horizontal area of a contact region horizontally neighboring the memory array region, the conductive contact structures in electrical communication with at least some of the first conductive pads and at least some of the second conductive pads.

4. The microelectronic device of claim 3, wherein at least some of the conductive contact structures are in electrical communication with charge pumps within the logic region of the base structure.

5. The microelectronic device of claim 1, wherein:
the first conductive pads comprise a row of the first conductive pads; and
the second conductive pads comprise a row of the second conductive pads horizontally extending parallel to the row of the first conductive pads.

6. The microelectronic device of claim 1, further comprising conductive wires attached to the first conductive pads and the second conductive pads.

7. The microelectronic device of claim 6, wherein at least some the first conductive pads and at least some of the second conductive pads are configured and positioned to receive power signals from at least some of the conductive wires.

8. The microelectronic device of claim 7, wherein one or more of the first conductive pads and one or more of the second conductive pads are electrically connected to a voltage regulator device.

9. The microelectronic device of claim 1, wherein at least some of the first conductive pads are offset from at least some of the second conductive pads in a first horizontal direction by at least one distance within a range of from about 15 µm to about 50 µm.

10. The microelectronic device of claim 9, wherein at least one of the first conductive pads is offset from at least one other of the first conductive pads in a second horizontal direction orthogonal to the first horizontal direction by at least one additional distance greater than or equal to about 15 µm.

11. The microelectronic device of claim 10, wherein at least one of the second conductive pads is offset from at least one other of the second conductive pads in the second horizontal direction by at least one further distance greater than or equal to about 15 µm.

12. The microelectronic device of claim 1, wherein at least one of the second conductive pads is offset from two of the first conductive pads most proximate thereto in first horizontal direction, and is at least partially interposed between the two of the first conductive pads in a second horizontal direction perpendicular to the first horizontal direction.

13. A memory device, comprising:
a base structure comprising a region comprising complementary metal-oxide-semiconductor (CMOS) circuitry, and an additional region horizontally neighboring the region and substantially free of the CMOS circuitry;
a conductive routing tier overlying the base structure;
a stack structure overlying the conductive routing tier and comprising conductive material and insulative material vertically alternating with the conductive material;
a memory array comprising strings of memory cells extending through the stack structure, the memory array within a horizontal area of the region of the base structure;
an additional conductive routing tier overlying the stack structure;
conductive contacts horizontally offset from the memory array and extending between the conductive routing tier and the additional conductive routing tier;
first conductive pads overlying the additional conductive routing tier and within a horizontal area of the additional region of the base structure, the first conductive pads in electrical communication with some of the conductive contacts; and
second conductive pads overlying the additional conductive routing tier and horizontally interposed between the first conductive pads and at least some of the strings of memory cells of the memory array, the second conductive pads in electrical communication with some other of the conductive contacts.

14. The memory device of claim 13, wherein the second conductive pads are positioned with the horizontal area of the region of the base structure.

15. The memory device of claim 14, wherein:
the some of the conductive contacts in electrical communication with the first conductive pads are located within the horizontal area of the additional region of the base structure; and
the some other of the conductive contacts in electrical communication with the second conductive pads are located within the horizontal area of the region of the base structure.

16. The memory device of claim 13, wherein:
the second conductive pads are horizontally interposed between the first conductive pads and the memory array in a first horizontal direction; and
horizontal centers of at least some of the second conductive pads are substantially aligned with one another in a second horizontal direction orthogonal to the first horizontal direction.

17. The memory device of claim 13, wherein:
the second conductive pads are horizontally interposed between the first conductive pads and the at least some of the strings of memory cells of the memory array in a first horizontal direction; and
a horizontal center of each of the second conductive pads is horizontally offset, in a second horizontal direction orthogonal to the first horizontal direction, from a horizontal center of each of the first conductive pads.

18. The memory device of claim 13, wherein the second conductive pads are arranged in a row interposed between the first conductive pads and the at least some of the strings of memory cells of the memory array in a first horizontal direction, the row extending in a second horizontal direction perpendicular to the first horizontal direction.

19. The memory device of claim 13, wherein at least one of the second conductive pads horizontally overlaps at least one of the strings of memory cells of the memory array.

20. The memory device of claim 13, further comprising conductive wires bonded to at least some of the first conductive pads and at least some of the second conductive pads, the conductive wires coupled to leads of a lead frame.

21. The memory device of claim 13, wherein:
at least one of the second conductive pads comprises a supply voltage ($V_{cc}$) pad; and
at least one other of the second conductive pads comprises a ground ($V_{ss}$) pad.

22. An electronic system, comprising:
an input device;
an output device;
a processor device operably connected to the input device and the output device; and
a memory device operably connected to the processor device and comprising:
a stack structure comprising conductive structures vertically interleaved with insulative structures;
a base structure vertically underlying the stack structure and comprising a logic region including logic circuitry;
a memory array comprising strings of memory cells vertically extending through the stack structure, the memory array positioned within a horizontal area of the logic region of the base structure; and
bond pads vertically overlying the stack structure and in electrical communication with the logic circuitry, the bond pads comprising:
first bond pads positioned outside of the horizontal area of the logic region of the base structure; and
second bond pads positioned within of the horizontal area of the logic region of the base structure.

23. The electronic system of claim 22, wherein the logic circuitry of the base structure comprises complementary metal-oxide-semiconductor (CMOS) circuitry.

24. The electronic system of claim 22, wherein the memory device comprises a 3D NAND Flash memory device.

* * * * *

UNITED STATES PATENT AND TRADEMARK OFFICE
CERTIFICATE OF CORRECTION

PATENT NO. : 12,171,096 B2  
APPLICATION NO. : 17/445045  
DATED : December 17, 2024  
INVENTOR(S) : Yu et al.

Page 1 of 1

It is certified that error appears in the above-identified patent and that said Letters Patent is hereby corrected as shown below:

In the Specification

Column 8, Lines 56-57, change "two hundred and fifth-six (256)" to --two hundred and fifty-six (256)--

Signed and Sealed this
Twenty-fifth Day of March, 2025

Coke Morgan Stewart
*Acting Director of the United States Patent and Trademark Office*